United States Patent [19]

Weekamp et al.

[11] Patent Number: 5,113,566
[45] Date of Patent: May 19, 1992

[54] METHOD OF PRODUCING A MULTILAYER PIEZOELECTRIC ELEMENT

[75] Inventors: Johannes W. Weekamp; Harry W. J. Pront, both of Eindhoven, Netherlands

[73] Assignee: U.S. Philips Corporation, New York, N.Y.

[21] Appl. No.: 651,896

[22] Filed: Feb. 6, 1991

[30] Foreign Application Priority Data

Feb. 7, 1990 [NL] Netherlands ............... 9000291

[51] Int. Cl.$^5$ ........................................ H01L 41/22
[52] U.S. Cl. ................... 29/25.35; 310/328; 310/368
[58] Field of Search .......... 29/25.35; 310/328, 365, 310/366, 368

[56] References Cited

U.S. PATENT DOCUMENTS

4,845,399 7/1989 Yasuda et al. ................ 310/366

FOREIGN PATENT DOCUMENTS

0292980 12/1986 Japan ......................... 310/366

Primary Examiner—Carl E. Hall
Attorney, Agent, or Firm—Norman N. Spain

[57] ABSTRACT

A method of producing a multilayer piezoelectric element. The multilayer is formed of layers of piezoelectric synthetic resin material, such as PVDF and metal layers, such as Al. The multilayer is made form-retaining and mechanically stable by use of heat and pressure. Connections are provided on two facing sides of the multilayer which preferably include at least one sprayed metal layer, which preferably consists of the same metal as the metal layers of the multilayer.

5 Claims, 1 Drawing Sheet

METHOD OF PRODUCING A MULTILAYER PIEZOELECTRIC ELEMENT

BACKGROUND OF THE INVENTION

The invention relates to a method of producing a piezoelectric element, in which electrically conducting electrode layers and piezoelectric synthetic material layers are stacked alternately to form a multilayer, which element is provided, on two facing sides, with planar electrodes in such a manner that the alternate electrode layers are electrically connected to one or to the other planar electrode. The invention also relates to a piezoelectric element produced by means of this method.

Using such a piezoelectric element an electrical potential difference can on the one hand be converted into a mechanical deformation. On the other hand subjecting such as element to a mechanical force produces an electric voltage. Piezoelectric elements are used for example in audio equipment (loudspeakers, headphones, microphones, hydrophones, sonar equipment), in strain detectors and in energy transformers.

A method of producing a multilayer piezoelectric element of the type described in the opening paragraph is inter alia disclosed in the PTC-application filed under the international application number WO 88-04475. Therein the production of a piezoelectric element via a co-extrusion process is described. In this process electrode layers of a synthetic resin material and piezoelectric layers are alternately stacked to form a multilayer. Polymethylacrylate is used as the electrode material for the electrode layers. Polyvenylidene fluoride (PVDF) is used as the piezoelectric material for the piezoelectric layers. Planar electrodes are, subsequently deposited onto facing sides in the form of a silver strip. The electrode layers are stacked in the co-extrusion process in such a manner that the consecutive electrodes extend alternately to the one or to the other above-mentioned side of the multilayer.

The prior art method has a number of disadvantages. For example it has appeared in practice that the electrode layers of the known piezoelectric element are rather thick as a direct result of the extrusion process used. This has the disadvantage that in this prior art piezoelectric element, the quantity of active piezoelectric material at a given volume and at a given piezoelectric synthetic resin material (the "volume efficiency") is relatively small. It is not very readily possible to produce, by means of co-extrusion, optimally functioning multilayer piezoelectric elements, with electrode layer thicknesses less than 25 $\mu$m and more particularly less than 10 $\mu$m.

Applicants have furthermore found that the piezoelectric elements produced by means of the prior art method do not have optimal properties. In particular, the contact resistance between planar electrodes and the electrode layers is rather high. As a result thereof the prior art piezoelectric elements have an unacceptably high heat loss by dissipation, when these elements are subjected to an a.c. voltage. This heat dissipation appears to increase with time.

SUMMARY OF THE INVENTION

The invention has inter alia for its object to provide a method which does not have the disadvantages of the prior art method mentioned in the foregoing. For that purpose, the invention provides in particular a method in which multilayer piezoelectric elements having a high "volume efficiency" can be produced. According to a further object of the invention, a method is provided by means of which a piezoelectric element can be produced which is mechanically stable and dimensionally stable and has a relatively low heat dissipation.

These and other objects are achieved by a method of the type described in the opening paragraph, which according to the invention is characterized in that piezoelectric synthetic resin material layers onto which a metal layer is deposited on one side, are stacked to form a multilayer, and in that this stacked multilayer is subjected to a heat treatment under increased pressure.

DETAILED DESCRIPTION OF THE INVENTION

Figure 1A:
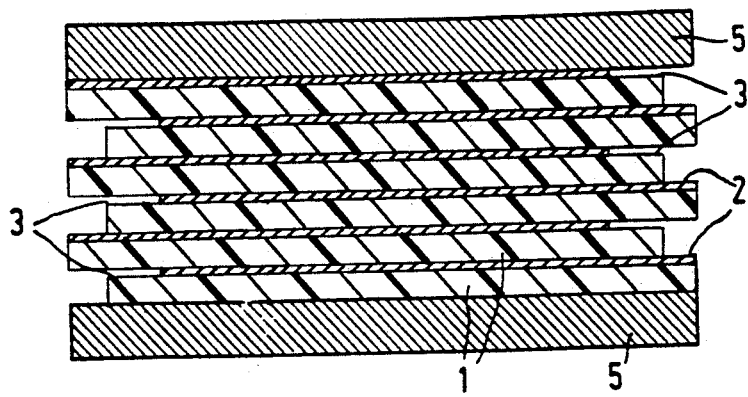
FIG. 1a and FIG. 1b are cross-sectional views showing, schematically, stacking of the multilayer in accordance with the method of the invention.

By means of the method according to the invention multilayer piezoelectric elements can be manufactured, wherein the thickness of the separate layers is very small, so that layer thicknesses of 1 $\mu$m or less may be realised without any problem. If a piezoelectric synthetic layer is used onto which a metal layer is deposited by evaporation then electrode layer thicknesses of less than 0.1 $\mu$m and even of less than 0.05 $\mu$m can be applied in the multilayer piezoelectric element.

The heat treatment of the multilayer under the influence of the increased pressure is an essential manufacturing step in the inventive method. This manufacturing step allows the multilayer to retain its form and makes it mechanically stable. The mechanical strength obtained is due to the fact that the free surface of the metal layer is firmly connected to the free surface of an adjacent piezoelectric synthetic layer during this manufacturing step. Therefore it may be obvious that preferably single-sided metallised synthetic layers should be used in the method of the invention, and not synthetic layers metallised on both sides, which must alternate with uncoated synthetic layers.

In principle, all types of synthetic layers are eligible for use in the piezoelectric element. Examples are: polyvenylidene fluoride, polyvenyl fluoride, polycarbonate, polyamides, and polyvenylidene fluoride-trifluoro ethylene.

An interesting embodiment of the method according to the invention, is characterized in that the heat treatment is effected at a temperature which is 5°-15° C. below the melting point of the piezoelectric synthetic layer. It has been found that the capability of the multilayer to retain its form may be obtained in a very fast and efficient manner in the this temperature range. The use of a lower temperature has the disadvantage that the heat treatment at an increased pressure requires relatively much time. If the difference in temperature between the melting point and the temperature of the heat treatment is less than 5° C., there is a risk of flashover occurring in the finished product.

An other advantageous embodiment of the method according to the invention is characterized in that the contact planes are provided in the form of a sprayed metallised layer. The use of this measure results in a large mechanical strength between the contact planes and the electrode layers.

Furthermore, the invention also relates to a multilayer piezoelectric element manufactured in accordance with the method described in the foregoing. According to the invention, this element is characterized in that the material composition of the electrode layers and the contact planes is identical. The use of identical materials in the electrode layers and the contact planes also is advantageous for obtaining a large mechanical strength of the connection between these two parts. Moreover, a good electric conduction between the two parts is obtained in this case, and the contact resistance in particular is very low.

In the case in which the electrode layers and the contact planes are made of Al, leads can directly be secured to the sprayed metallised contact planes, for example by means of percussion welding.

However, of particular interest is that embodiment of the piezoelectric element that is characterized, according to the invention, in that the contact planes include also a second sprayed metallized layer, which mainly contains copper, zinc, or an alloy of zinc and tin. It has been found that the second sprayed metallized layer is firmly attached to the first sprayed metallised layer. A lead wire may be attached to this second sprayed metallized layer in a simple manner, for example by soldering, when the second sprayed metallised layer is made of copper or by means of resistance welding when a second sprayed metallised layer of a zinc or an alloy of zinc and tin is used.

Embodiments of the invention will now be described in greater detail by way of example with reference to the figures of accompanying drawing in which the relative and absolute dimensions of the different parts of the drawings are not shown to scale for the sake of clarity.

EMBODIMENT

A thin layer of piezoelectric synthetic resin material (polyvenylidene fluoride; PVDF) was metallised on one side with a layer of Al (layer thickness 0.03 $\mu$m), which was deposited by means of thermal evaporation. The layer thickness of PVDF foil can range from 3 to 40 $\mu$m. It was found that the layer thickness of the metal layer must be greater than 0.01 $\mu$m to obtain an adequate conductance. Layer thicknesses ranging from 0.02 to 0.05 $\mu$m provide good results. The metal layer can alternatively be deposited by means of a sputtering process, but thermal evaporation is preferred from an economical point of view.

Figure 1B:
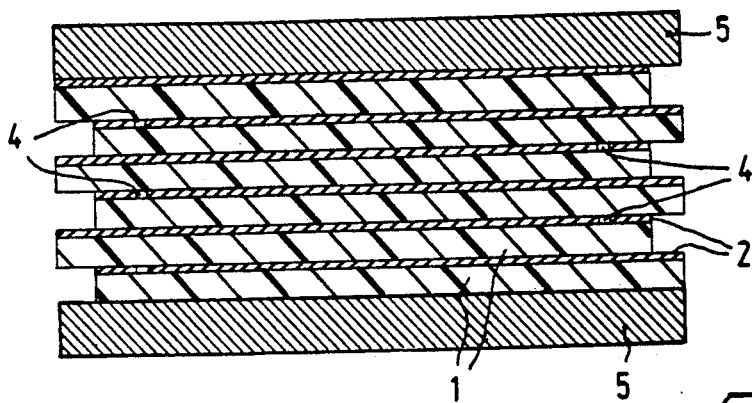

After metallisation, the synthetic resin material layers were cut to strips having a length of, for example, 50 cms, and with approximately the width of the piezoelectric multilayer elements to be produced, for example 0.42 cms. A number of the metallised foil strips (20–2000) were subsequently stacked to form a multilayer. FIGS. 1a and 1b are schematical cross-sectional views of such a multilayer, wherein for the sake of clarity only six of these stacked strips are shown. Here the PVDF foils 1 are shown which are provided with a layer 2 of Al. The foils are stacked such that they are shifted relative to each other so that the successive metal layers alternately project to the one or to the other side. By covering strips of the foil during the Al-evaporation process, an edge 3 of the foil strips is not coated with an Al layer. (FIG. 1-a). It is alternatively possible to deposite metalless conductors 4 after metallisation of the complete foil by means of a laser (FIG. 1-b). The presence of these uncoated portions or conductors prevent shortcircuiting between the contact planes to be deposited on the side edges of the multilayer. The stacked multilayer is provided with a covering layer 5 at the upper and the lower side. Preferably, this layer is of the same material as the piezoelectric synthetic material layers. It is alternatively possible to use for this purpose a plurality of non-metallised synthetic material layers or a single, relatively thick cover layer.

The stacked piezoelectric multilayer is subsequently compressed at a pressure of 2–3 MPa. Portions of both sides are covered by means of a mask, so that only those portions on which the connection must be deposited remain bare. In the present case these connections are deposited by means of a metal spraying procedure, whereby a first layer of Al is provided. Subsequently, the multilayer provided with the connection is exposed to temperatures of 165°–175° C. for approximately 30 minutes at the pressure mentioned in the foregoing. The multilayer retains its form and is mechanically stable because of the heat treatment at an increased pressure. The air is squeezed from between the successive metallized PVDF layers, while the Al layers are simultaneously attached to the adjacent PVDF layers. After cooling of the strips of the multilayer a second sprayed metallized layer of Cu is deposited on the first sprayed metallized layer. It is important that the first sprayed metallized layer (Al) is deposited before, and the second sprayed metallized layer (Cu) is deposited after the heat treatment. It was found that the heat treatment may distort the sides of the multilayer to such an extent, that the mechanical strength and the electric connection of a first sprayed metallized layer, GAl if deposited later is relatively low. This may cause the electric connection between the electrode layers and the contact planes to be broken during protracted usage. The second sprayed metallized layer (Cu) is deposited after the heat treatment, since Cu easily oxidizes at higher temperatures. Finally, the multilayer piezoelectric element thus produced is polarized under the influence of a high temperature (100°–140° C.) and a high electric field intensity (about 80 Mv/m).

Figure 2:
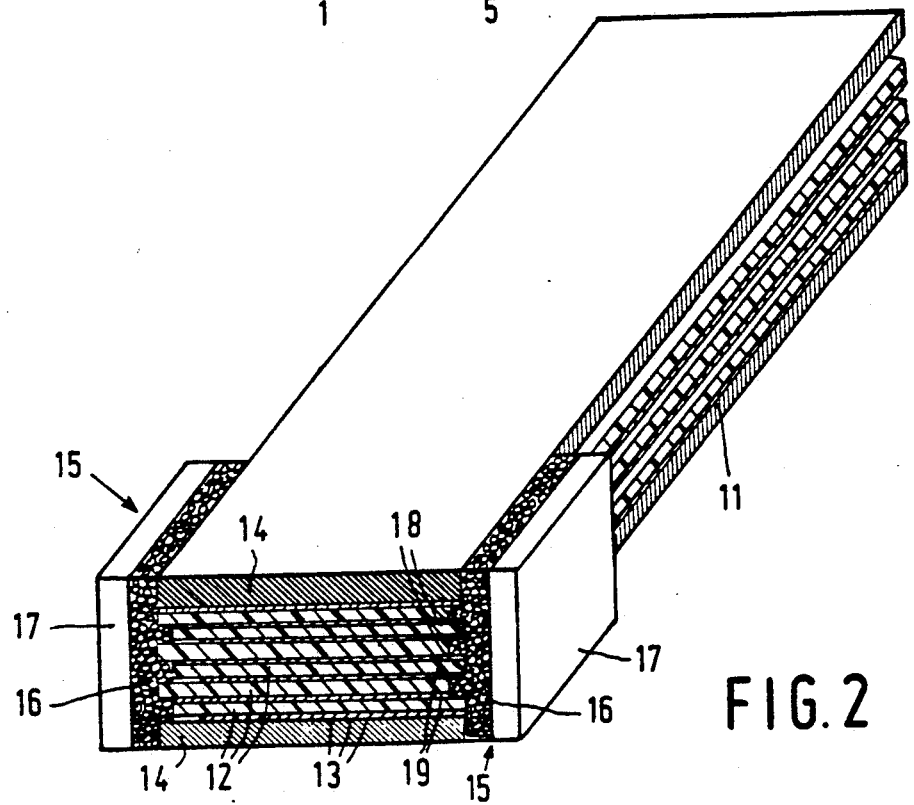
FIG. 2 is a perspective view of a multilayer piezoelectric element of the invention.

FIG. 2 shows a finished multilayer piezoelectric element according to the invention, its dimensions being $2.0 \times 0.42 \times 0.12$ cm$^3$. It consists of a multilayer 11 which is assembled from more than 100 piezoelectric PVDF synthetic material layers 12, having a thickness of 9 $\mu$m, upon which an electrically conducting Al electrode layer 13, having a thickness of 0.03 $\mu$m, is deposited on one side by thermal evaporation. For the sake of clarity, only six piezoelectric layers and 6 electrode layers are shown. Covering layers 14 are deposited on the top and bottom sides of the multilayer. Furthermore, the element has two connections 15, which partly cover two opposite sides. These connections comprise a first sprayed metallised layer 16 of Al and a second sprayed metallized layer 17 of Cu. The choice of Al as a first sprayed metallized layer provides a large mechanical rigidity as well as a low contact resistance between the connections and the multilayers, because the material of the electrode planes and the first sprayed metallized layer is identical. As this mechanical rigidity is directly proportional to the surface area between the sprayed metallized layer and the electrode plane, it is advantageous to allow the electrode planes to project slightly from the multilayer (in this case for 0.02 cms).

This is achieved by stacking the layers such that they are shifted relative to each other. In that case the first sprayed metallized layer still contacts a portion 18 of the surface area of the electrode layers.

The creepage paths 19 were formed on the PVDF foil by covering them partly during metallisation. This prevents short-circuits from occurring between the opposite connections 15 in the finished product. As the thickness of the creepage paths is relatively small (about equal to the thickness of the electrode planes 13, i.e. about 0.03 $\mu$m) with respect to tne dimensions of the sprayed metallised Al-particles, these particles cannot penetrate into the creepage paths. This prevents short-circuits from occurring, as has been mentioned.

The second Cu sprayed metallized layer forms a mechanically firm connection with the first Al sprayed metallised layer. A lead wire can be secured to the second sprayed metallised layer in a simple manner by means of soldering.

The product described has good piezoelectric and mechanical properties. The insulation resistance in particular is relatively high, of the order of $10^4$ MOhm. The contact resistance amounts to only a few mOhm. The piezoelectric element also has a very low heat loss under the influence of an a.c. voltage.

We claim:

1. A method of producing a piezoelectric element said method comprising:

a) depositing an electrically conducting metal electrode layer on a piezoelectric synthetic resin material layer;
   b) stacking a number of the resultant metal layer coated piezoelectric synthetic resin material layers in such a manner that alternate edges of the metal electrode layers extend out of two facing sides of the resultant stacked multilayer and the metal electrode layers are separated from one another by the piezoelectric synthetic resin material layers;
   c) subjecting the resultant stacked multi-layer to elevated heat and pressure and then
   d) providing the two facing sides with planar electrodes in such a manner that the metal electrode layers are alternatively electrically contacted by one or the other of the planar electrodes.

2. A method of claim 1 wherein the composition of the metal electrode layers and the planar electrodes are identical.

3. The method of claim 2 wherein the planar electrode layers comprise a second sprayed metallized layer which consists predominately of copper, zinc or an alloy of copper.

4. A method as claimed in claim 1 wherein the temperature employed while subjecting the stacked multi-layer to elevated heat and pressure is 5°–15° C. lower than the melting temperature of the piezoelectric synthetic resin material layers.

5. A method as claimed in claim 4, wherein the planar electrode are provided in the form of a sprayed metallised layer.

* * * * *